United States Patent [19]

Gilbert

[11] Patent Number: 4,990,803
[45] Date of Patent: Feb. 5, 1991

[54] LOGARITHMIC AMPLIFIER

[75] Inventor: Barrie Gilbert, Beaverton, Oreg.

[73] Assignee: Analog Devices, Inc., Norwood, Mass.

[21] Appl. No.: 328,966

[22] Filed: Mar. 27, 1989

[51] Int. Cl.$^5$ .................. G06F 7/556; G06G 7/24; H03K 3/26
[52] U.S. Cl. .................. 307/492; 307/310; 307/296.6; 307/491; 328/145
[58] Field of Search .............. 307/296.6, 491, 494, 307/492, 310; 330/297, 296, 138, 140, 289, 256; 328/144, 145, 168

[56] References Cited

U.S. PATENT DOCUMENTS

| | | | |
|---|---|---|---|
| 3,435,353 | 2/1966 | Sauber | 307/492 |
| 3,584,232 | 6/1971 | Wallace, Jr. | 307/492 |
| 3,605,027 | 9/1971 | Nichols | 307/492 |
| 3,668,535 | 6/1972 | Lansdowne | 307/492 |
| 4,333,023 | 6/1982 | Hood, Jr. | 307/492 |
| 4,565,935 | 1/1986 | Rolfe | 307/492 |
| 4,604,532 | 8/1986 | Gilbert | 307/492 |
| 4,724,337 | 2/1988 | Maeda et al. | 330/256 |

FOREIGN PATENT DOCUMENTS 0208305  9/1986  Japan .................. 307/492

Primary Examiner—Stanley D. Miller
Assistant Examiner—Toan Tran
Attorney, Agent, or Firm—Wolf, Greenfield & Sacks

[57] ABSTRACT

A multi-stage logarithmic converter of the "successive-detection" or "progressive-compression" type including circuitry providing an accurate, temperature-stabilized logarithmic transfer function. The gain stages are DC-coupled throughout, though each also employs a demodulator comprising a full-wave rectifier, allowing operation in both baseband and demodulating modes. The signal path is differential and is balanced, including the demodulators. Each gain stage is based on a differential amplifier, or "long-tail pair" operated in an open-loop mode and biased by a tail current generator which supplies a tail current that is both proportional to absolute temperature and compensated automatically for effects of finite transistor beta and base and emitter resistances. The demodulators are biased by a very low offset voltage which also is proportional to absolute temperature. The log intercept is temperature-stabilized by either employing a PTAT attenuator ahead of the complete amplification system or by introducing at the output node (a current summing junction) a current which varies with temperature in such a way as to offset intercept movement which otherwise would be generated.

6 Claims, 12 Drawing Sheets

LOGARITHMIC AMPLIFIER

FIELD OF THE INVENTION

This invention relates to logarithmic amplifiers, and, more particularly, to a high performance, fully calibrated, temperature compensated monolithic logarithmic amplifier providing accurate logarithmic intercept and slope.

BACKGROUND OF THE INVENTION

Logarithmic amplifiers are used in many applications where signals of large dynamic range may be encountered. Thus, logarithmic amplifiers are useful, for example, in applications requiring compression of wide range analog input data and linearization of transducers having exponential outputs. The precision and stability of the logarithmic transfer function of such devices are characteristics of great importance to users of logarithmic amplifiers and of considerable challenge to designers of these products. Errors due to the temperature dependence of elements from which these amplifiers are built often are substantial. Moreover, even after temperature dependencies are removed, structural architectural details of design will introduce errors between the actual output at a particular input level and the best fit of th output over the full dynamic range of such a device, called "log conformity error". The absolute error is of particular importance in some applications.

The term "logarithmic converter" might be a more accurate term to use than "logarithmic amplifier," as amplification is generally not the primary purpose, although it is true that log converters may make use of distributed amplification. The emphasis herein is not primarily on providing amplification, but rather on making better measurement, or signal-conversion, devices. Most commercially available logarithmic converters are only loosely specified, uncalibrated and unstable, and are designed for a limited range of applications; they are not high performance devices capable of low absolute error and good log conformity in a wide range of applications and over a wide range of temperature and other conditions.

There are three basic approaches to the generation of an output representing a logarithmic value of a voltage or current. The first approach is based on the exponential PN junction law. This type of converter is generally suited to low-frequency applications, particularly to situations in which the input is in the form of a current. Using an electrometer grade operational amplifier with the PN junction (usually a transistor) in a feedback path, accurate operation is possible from picoamp levels to several hundred microamps. The bandwidth of such converters is generally low and signal dependent. Second, logarithmic conversion can be based on high resolution analog to digital conversion. In such systems, the input analog signal is first digitized and then digital signal processing is used to generate the logarithm mathematically. The accuracy of the conversion in the latter case becomes progressively worse as the input signal gets smaller. By using a logarithmic analog to digital converter, the numerical output can maintain good accuracy over several decades. However, the bandwidth of this approach is also very limited—perhaps only a few kilohertz. The third category of converters is based on some type of approximation resulting from the combined outputs of several cascades nonlinear amplifier stages, each of which contributes to the combined output over just a small part of the total dynamic range. The advantage of this approach is that the power gain needed to achieve operation down to low signal levels is distributed over many stages. As a consequence, the overall bandwidth can be very high and relatively independent of signal amplitude. In practice, the major challege is to ensure that individual segments of the function combine smoothly and accurately. A characteristic of these converters is the periodic ripple in the transfer curve, which can only be reduced by increasing the number of stages each having a correspondingly smaller gain. Such converters will be called "multi-stage" converters herein.

FIG. 1 shows a very basic system for a multi-stage logarithmic converter 10 consisting of n gain stages 12-1 through 12-n, each of which exhibits the response 14 of FIG. 2, which is linear for voltage inputs within the range $-E$ to $+E$, in which range the gain is G. For larger inputs, the incremental gain is unity. It is well-known that the output $V_{n+1}$ of the last stage 12-n can approximate a logarithmic function of the input voltage $V_1$, to an arbitrary degree of smoothness dependent solely on the stage gain, G.

In principle, the stages can be DC-coupled, but in practice, this will often be precluded if the gain is high, due to unavoidable residual offset voltages in the early stages. Thus, most monolithic implementations based on this approach are AC-coupled, often with a high-pass corner frequency that prevents use in many low-frequency applications. One such commercially available device, for example, has a high pass corner at 10 MHz, but its upper usable frequency is about 160 MHz.

FIG. 3 shows a slightly different scheme for a logarithmic converter 16. Again, n gain stages 18-1 through 18-n are used, each having the transfer function of FIG. 4, which shows a gain G for input voltages between $-E$ and $+E$; but in this case, the incremental gain drops immediately to zero for voltages of greater amplitude. The logarithmic approximation is now developed by summing the outputs of all of the stages in an adder 20, rather than by use of the output $V_{n+1}$ from the final stage. The overall transfer function is very similar to that generated by the scheme of FIG. 1, differing primarily in the way the function behaves for large inputs. Connected as shown, there is no further increase in output $V_0$ as soon as the output $V_2$ of the first gain stage is into the limiting range of zero gain, so the net output of the converter is always too low thereafter. By contrast, the output of the cascade of FIG. 1 continues to increase linearly, faster than a true log curve, so its output is always too high after its first stage goes into the limiting region of operation. However, if one includes the input voltage $V_1$ in the summation of FIG. 3, the behavior of that system starts to look more like the behavior of the FIG. 1 system. The limiting function can be separated from the gain function in the FIG. 3 arrangement, to provide a parallel scheme such as that shown in FIG. 5 at 24, wherein the inputs to the limiters 26 (j-1) through 26-(k-1) are derived from amplified or attenuated segments of the input signal. This approach is used in many commercial integrated circuit log converters. The number of gain elements, k, and the number of attenuators, j, may be different, and one or both may be zero. The limiters may be simply differential amplifiers (often called "long tail" pairs) with open collectors, making the output summation of collector currents very straightforward. Achieving the precise gain or attenuation needed to make all the segments fit together poses design challenges. In many prevalent commercial components, the accuracy of the rudimentary long tail pairs and their associated biasing circuitry is extremely poor.

The FIG. 5 type of circuit is commonly referred to as a "video log-amp" and is used in baseband modes, usually over a relatively small dynamic range.

A further variation is illustrated at 30 in FIG. 6. This kind of converter includes not only gain elements 32-1 through 32-n, but also a corresponding set of demodulators (i.e., broadband rectifiers or detectors) 34-1 through 34 n in place of linear summation. Such converters are used where it is necessary to recover the envelope of an amplitude-modulated RF input, and will be referred to here as "demodulating converters." The output is low-pass filtered (not shown) to recover the modulation envelope. These circuits are often AC coupled t avoid the problems from input-stage voltage offset, but they also can be DC coupled. While primarily designed for use in demodulating applications, this type of logarithmic converter can also be used in baseband modes.

Practical implementations of these prior art approaches invariably suffer from temperature dependencies which degrade their ability to provide an accurate output conforming to a log-law relationship.

Thus, there is no prior art log-converter design useful for both low frequency and high frequency applications, which is inheerently free of sensitivity to temperature variations of production tolerances of the devices comprising the active elements, so as to provide high accuracy log-law performance over a wide temperature range and in the presence of large production variations.

Therefore, it is an object of the present invention to provide a high-performance log amplifier useful over a wide frequency range.

Another object is to provide a log amplifier which is temperature compensated.

Still another object is to provide a log-converter design which is inherently free of sensitivity to temperature variations and production tolerances, so as to provide high auccracy log-law performacne over a wide temperature range and in the presence of large production variations.

SUMMARY OF THE INVENTION

The present invention comprises, at least in part, a log converter which is of the type shown in FIG. 6. The gain stages are DC-coupled throughout. It has a balanced differential signal path, including the demodulators, which are full-wave rectifiers instead of the half-wave rectifiers generally used in the arrangement of FIG. 6. This combination of features makes the converter usable in both baseband and demodulating modes. The use of the full-wave rectifiers results in an output which is at twice the carrier frequency in AC applications, simplifying the design of the low pass filters used to recover the modulation components. Special design techniques are used herein to ensure high accuracy of log-law conversion performance in the presence of many design tolerances, including lot-to-lot transistor variations, and over temperature and power supply variation extremes.

Each gain stage is based on a differential amplifier, or "long-tail pair" operated in an open-loop mode and biased by a tail current generator which supplies a tail current that is both proportional to absolute temperature and compensated automatically for effects of finite transistor beta and base and emitter resistances.

The demodulators employ a very low offset voltage which also is proportional to absolute temperature.

The foregoing and other features, objects and advantages of the invention will be more fully understood from the detailed description below, which should be read in conjunction with the accompanying drawing, such detailed description and drawing being exemplary only, and not limiting.

DETAILED DESCRIPTION

Figure 1:
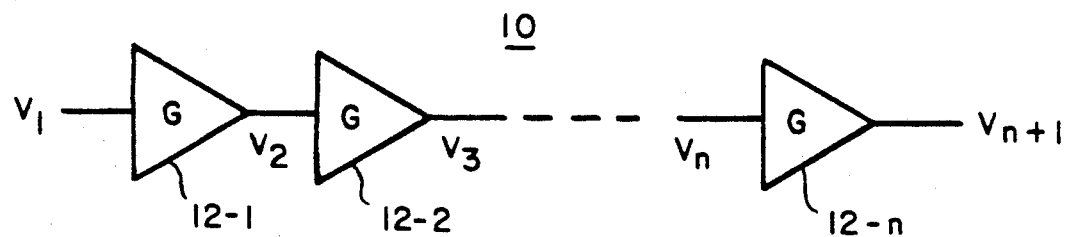
FIG. 1 is a simplified block diagram of a series-connected "two-slope" logarithmic converter according to the prior art.
Figure 2:
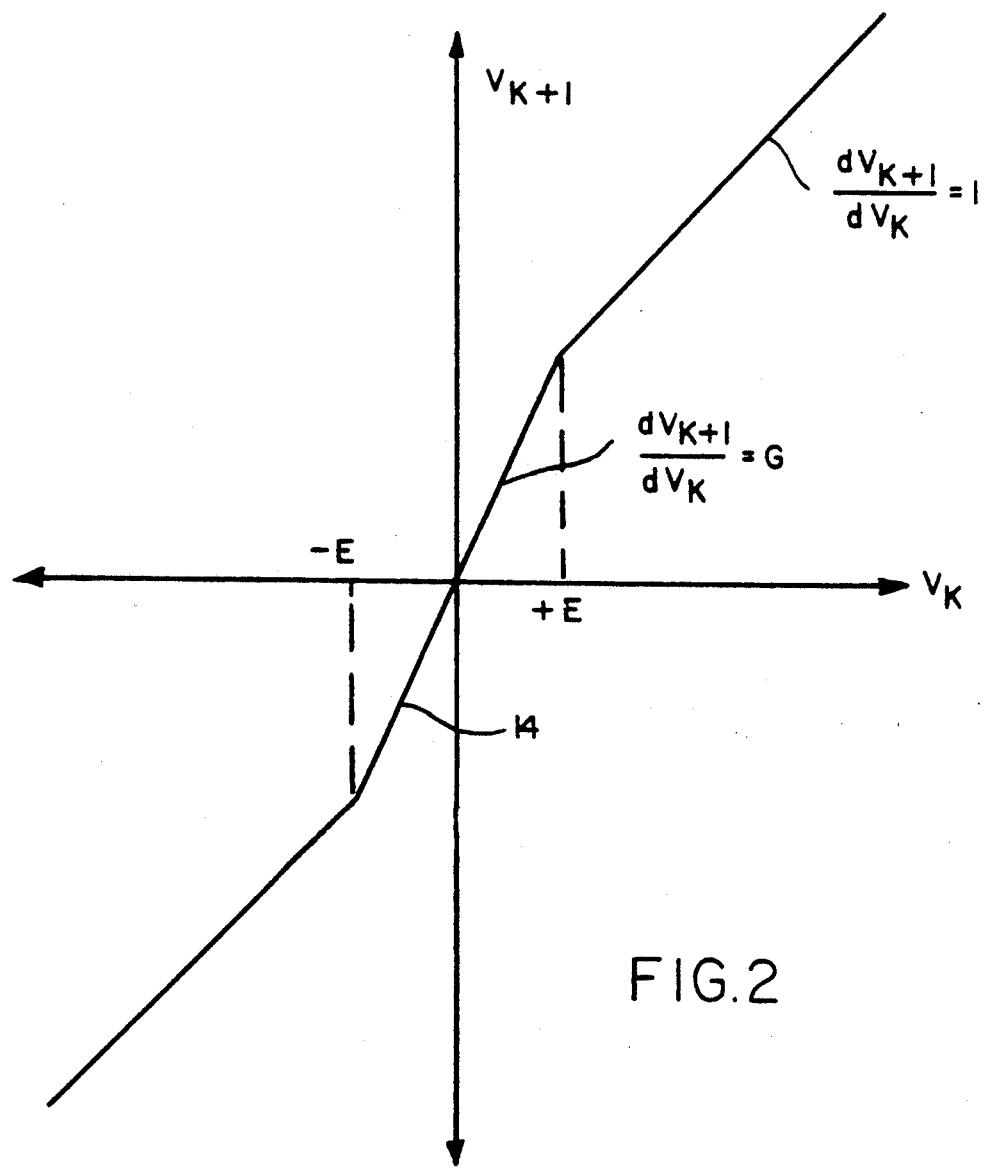
FIG. 2 is an idealized representation of the two-slope response of the gain elements of FIG. 1.
Figure 3:
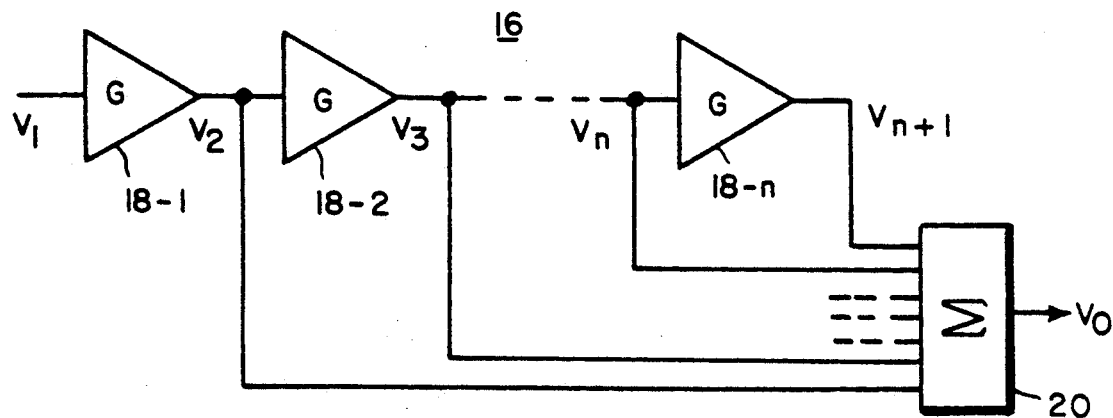
FIG. 3 is a simplified block diagram of a second type of prior art logarithmic converter using series-connected limiting amplifiers.
Figure 4:
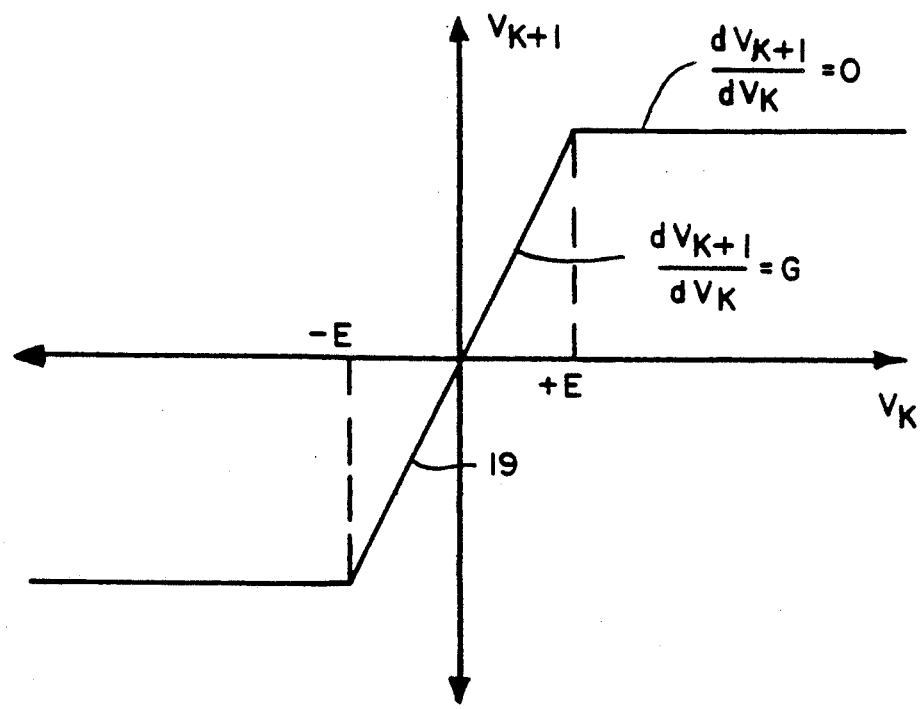
FIG. 4 is an idealized representation of the transfer characteristic of the limiting amplifiers of FIG. 3.
Figure 5:
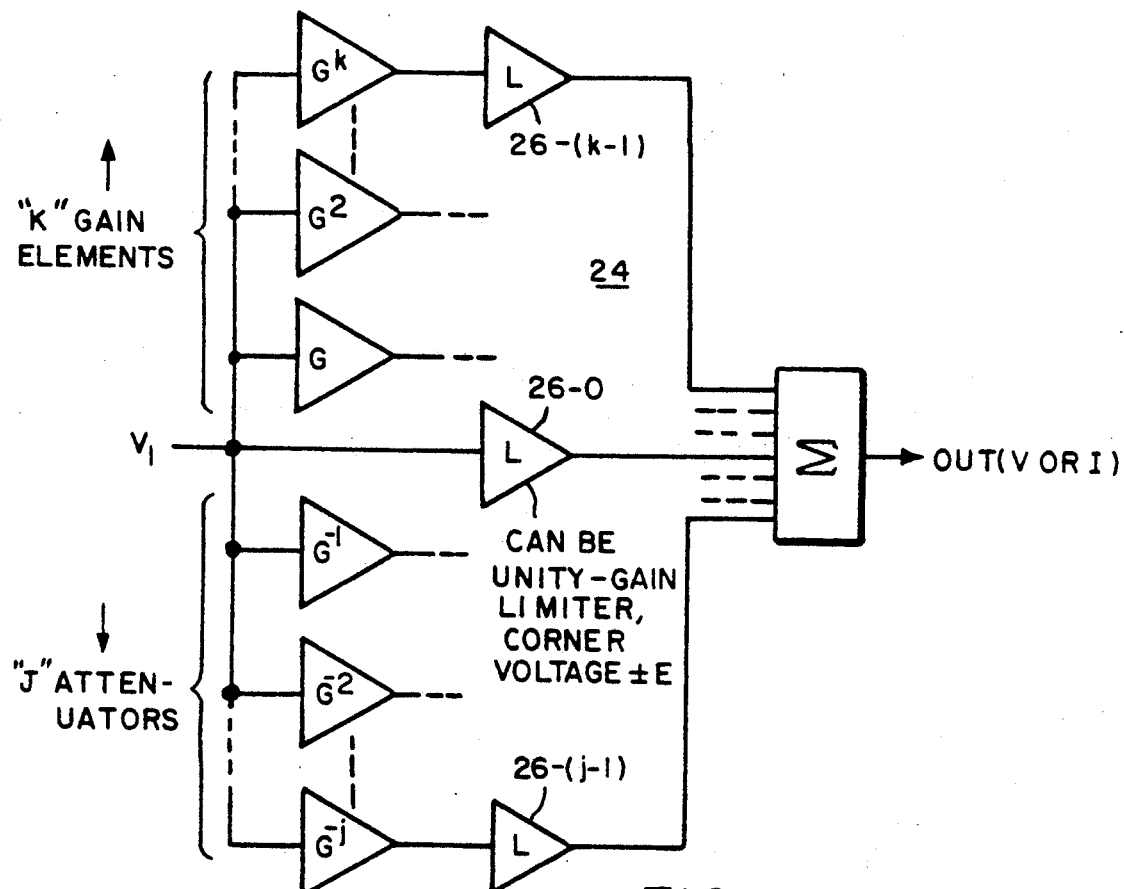
FIG. 5 is a simplified block diagram of a parallel type summation logarithmic amplifier according to the prior art.
Figure 6:
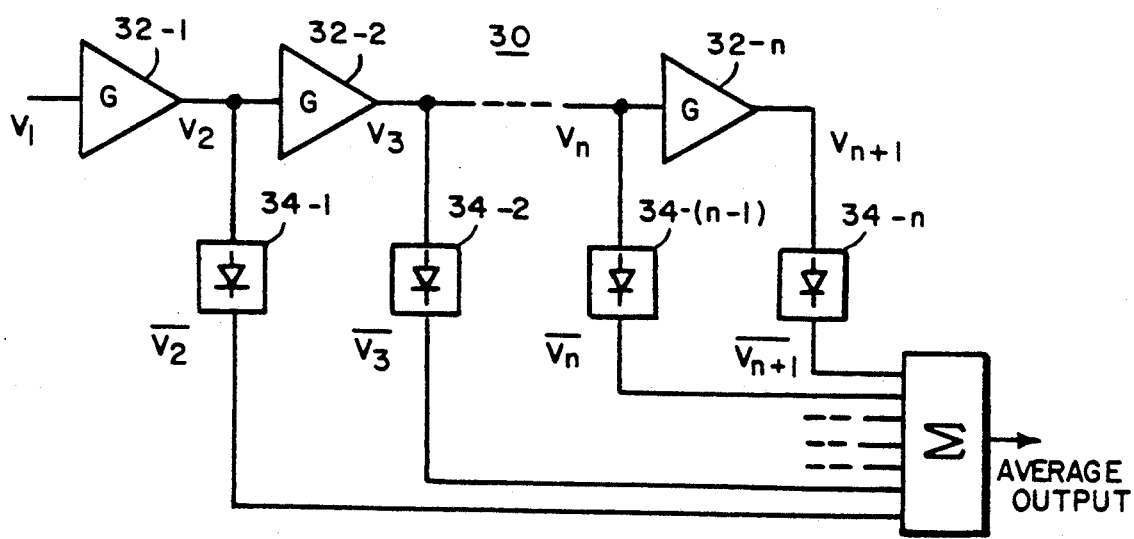
FIG. 6 is a simplified block diagram of a "successive detection" or "progressive compression" logarithmic converter according to the prior art.
Figure 7:
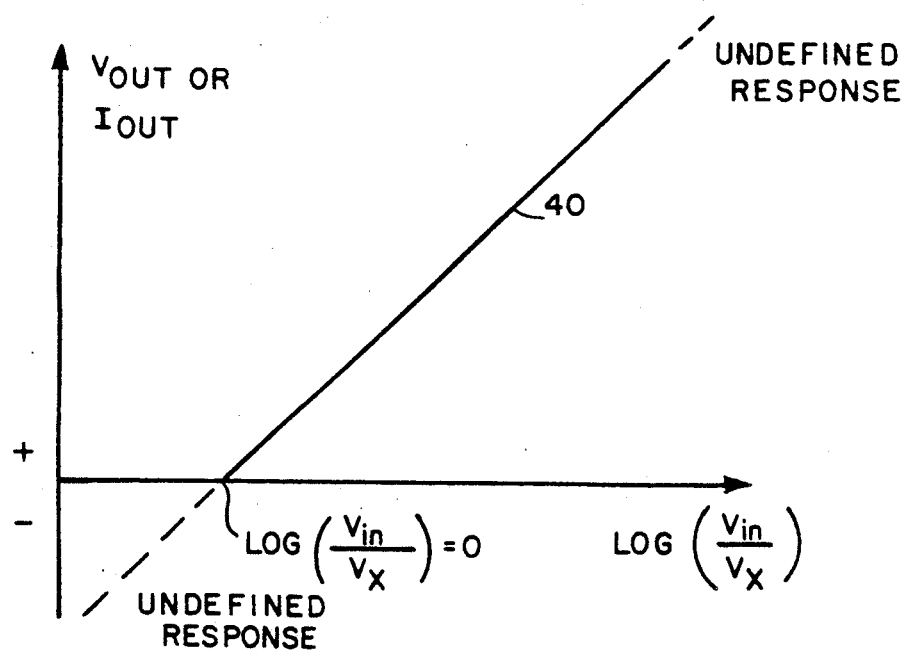
FIG. 7 is a diagram of an ideal logarithmic response from a logarithmic converter.

FIG. 7 depicts an ideal logarithmic response 40 for a device which generates an instantaneous voltage or current output proportional to the logarithm of its instantaneous input voltage. A logarithm is determinate only for a dimensionless positive quantity, so the input voltage (or current) must effectively be divided by a "reference" voltage (or current). The input voltage is represented by the variable $V_{in}$ and the reference voltage, by the variable $V_x$. The value of the logarithm is zero when the argument is unity and $V_{in} = V_x$. The variable $V_x$ can be called the "log-intercept" or "intercept" voltage. For a real logarithmic converter, of course, the output may not actually be zero for an input of $V_x$, due to the effect of any input offset voltage, as well as limitations in the approximation function at low input levels. The intercept voltage is not affected by these considerations and in practice is defined to high accuracy by extrapolation from the central, more-nearly ideal, region of the transfer function, corresponding to higher inputs. According to the present invention, $V_x$ is constrained by design to be nominally 1 mV, and it is accurately trimmed during manufacture to that value. The intercept voltages can be altered merely by subtracting or adding an offset to the output. It is important to preserve a precise intercept, since ambiguity in the intercept translates directly to an uncertainty in the input magnitude. Preservation of a precise intercept, therefore, is an important object of the converter design disclosed herein.

A voltage-input, current-output log converter must thus have an overall transfer function of the form $$I_{out} = I_y \log \frac{V_{in}}{V_x} \qquad (40)$$

where the absolute value sign indicates that, because of the use of full-wave rectifiers, the output response for inputs of either polarity is identical. Further, since the logarithm uses a base of 10, $I_y$ may be viewed as a "scaling current" or as the "slope" (i.e., current per decade). The accuracy of the output is thus critically dependent on two variables, $I_y$ and $V_x$, as well as the log function itself. Further, as will be seen later, the present invention provides two separate output currents, both scaled 1 mA per decade, the first (LOG+OUT) increasing positively with increasing $V_{in}$ and the other (LOG−OUT) increasing negatively, both passing through zero at $V_{in} = 1$ mV. The two outputs are thus:

$$\text{LOG + OUT output} = +1 \text{ mA} \log \frac{V_{in}}{1 \text{ mV}} \qquad (42)$$

$$\text{LOG − OUT output} = -1 \text{ mA} \log \frac{V_{in}}{1 \text{ mV}} \qquad (44)$$

Figure 8:
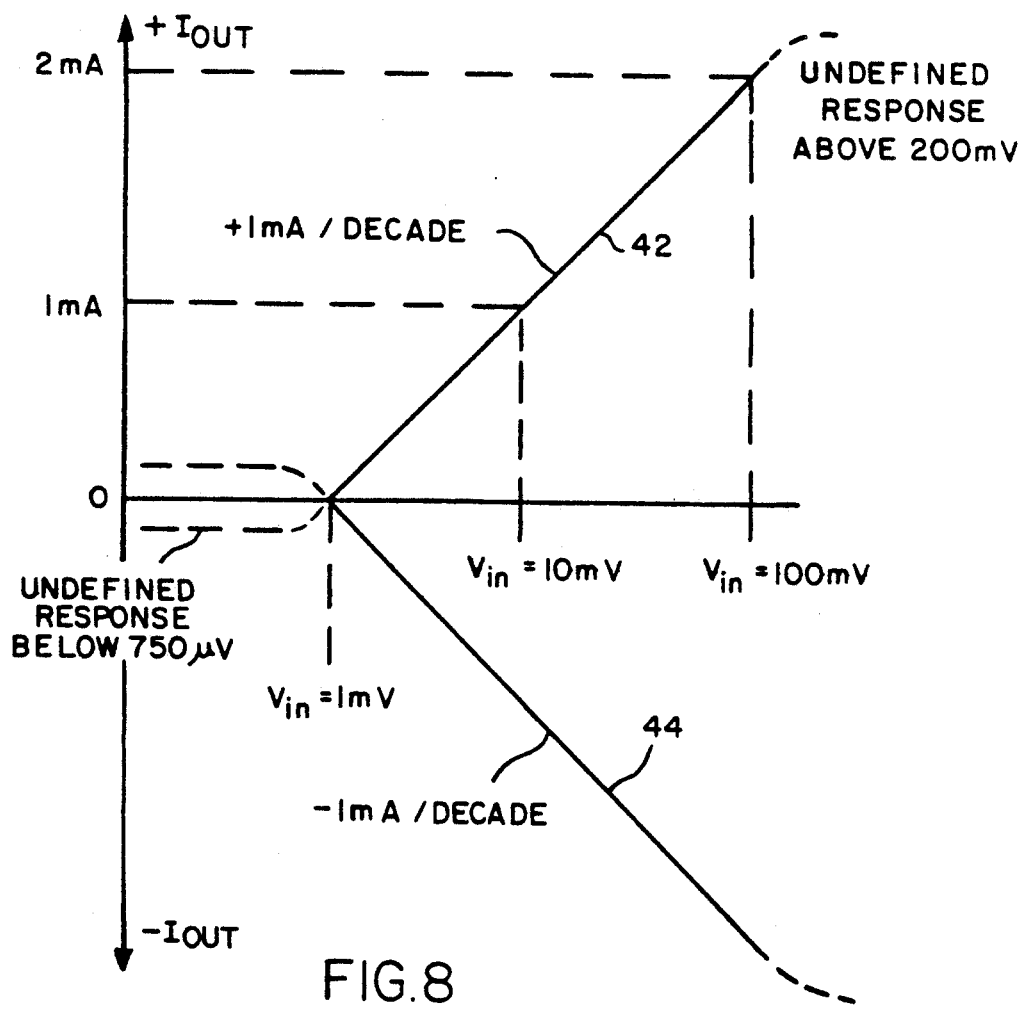
FIG. 8 is a diagram of the outputs of a logarithmic converter according to the present invention

These two outputs are shown in FIG. 8.

Stabilization of $V_x$

Figure 9:
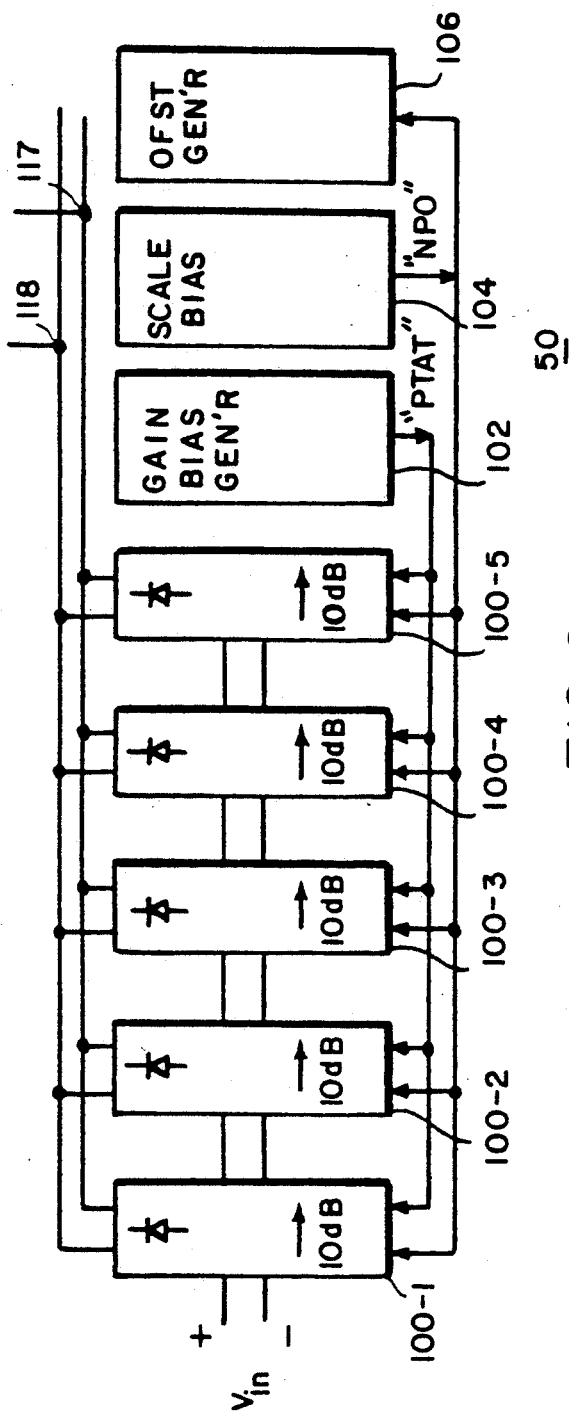
FIG. 9 is a block diagram of a logarithmic converter according to the present invention.
Figure 10:
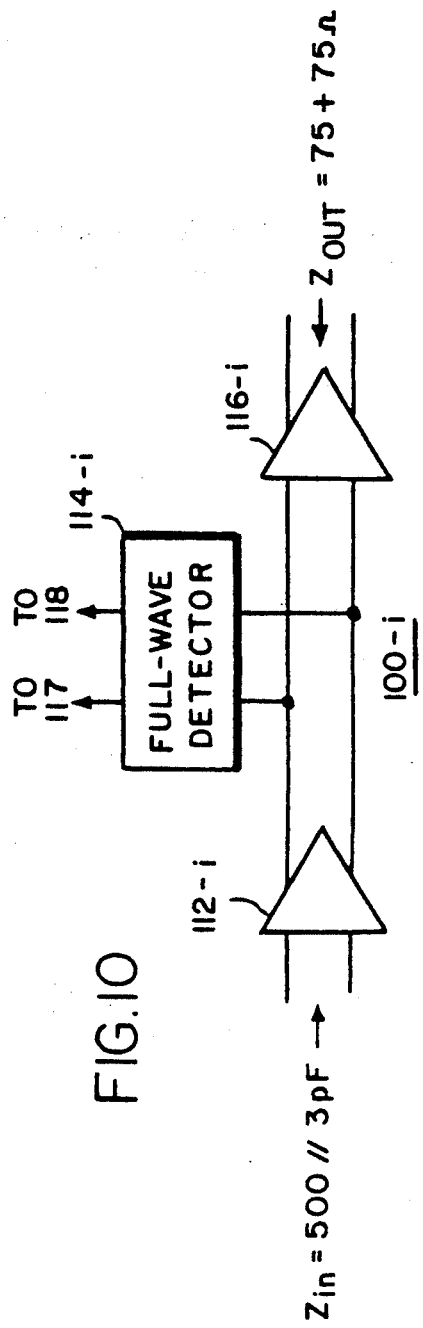
FIG. 10 is a simplified block diagram of each of the gain stages 100-i of FIG. 9.

Referring to FIG. 9, a block diagram is shown of a logarithmic converter 50 according to the present invention. The converter comprises a plurality of gain stages 100 1 through 100-n, a gain bias generator 102, which is common to all gain stages, a scale bias generator 104, and an offset generator 106. In the example of FIG. 9, the number of gain stages, n, is 5; however, a different number of gain stages may readily be used. A block diagram for each of the gain stages is shown in FIG. 10; though some slight modifications may be made in each gain stage, they can be considered identical so as not to unnecessarily complicate the discussion. Each gain stage 100-i comprises an emitter follower 112-i, having a differential input and balanced output, a full-wave detector 114-i, and a limiting amplifier 116-i. The emitter follower 112-i introduces a slight loss—i.e., about 0.07 dB. The amplifier 116 i provides a 10.07 dB, so that the overall stage gain is 10 dB. Of course, the stage gain is a matter of design choice.

The outputs from the detectors are a pair of currents, one negatively-going (i.e., current into the output node) and one positively-going (i.e., current out of the output node). The negatively-going output currents of each stage are summed at node 118 and the positively-going output currents are summed at node 117. The outputs of offset generator 106 are also provided to these nodes. The node 117 output is what has been called the LOG+OUT signal and the node 118 output is what has been called the LOG−OUT signal.

As indicated in FIG. 10, independent demodulation is provided in each stage.

The two bias generators 102, 104 and the gain stages are specially designed to accurately maintain exact scaling over a wide range of temperature and supply voltage variation, as well as to minimize inaccuracies in scaling due to lot-to-lot parameter variations.

The circuit for limiting amplifiers 116 is a long-tail pair in which the tail current is temperature compensated. The details of this circuit are disclosed in commonly assigned U.S. Pat. No. 4,929,909 filed on even date herewith by Barrie Gilbert and titled "Differential Amplifier with Gain Compensation", which is hereby incorporated by reference for its teaching.

The gain bias generator 102 causes the bias currents in the long tail pairs to be basically PTAT and it, rather than individual stages, is trimmed to set the overall gain. This assumes that adequate matching of gain can be achieved, to avoid the need for separate adjustments of each stage; apart from requiring more time to trim the circuit, this would require 8 additional probe pads on the integrated circuit die.

The scale bias generator 104, on the other hand, is designed so that the bias currents in the detector stages are basically temperature-stable, since these currents establish the 1 mA per decade output slope. A refernce voltage derived using the band-gap principle is first trimmed to a target voltage of 1.235 V at a test node, after which the detectors are individually trimmed to set the scaling. That voltage value results in minimum first-order temperature sensitivity. The output current of each stage must be trimmed to absolute value, to permit outputs from two or more of the present logarithmic converters to be summed while at the same time preserving scaling accuracy. This requires that the associated bias resistors also be trimmed absolutely.

Offset generator 106, if used, provides temperature compensation for the intercept voltage and removes the zero-signal bias current output at the detector stages. These are biased by the scale bias generator 104 and must be accurately trimmed.

Gain Stage Design

The gain stages 100 1 through 100-n must provide a small signal voltage gain of 10 dB which is stable over temperature and supply variations and which is essentially device independent, to minimize the lot-to-lot performance spread. Furthermore, the peak output voltage must be limited to a well defined value, so that the drive to the associated demodulator stage is at the correct level. The choice of circuit topology for the gain stages is quite important. The use of simple open-loop differential amplifiers, or "long tail pairs", is generally deprecated. They are perceived as difficult to design so as to achieve the necessary gain stability, and they are known to be sensitive to finite current gain (beta) and non ideal ohmic resistive components in the transistors. Therefore, it is a common practice to use feedback stabilized gain stages—i.e., amplifiers having open loop qains higher than the required gain but employing negative feedback to control the closed-loop gain. This approach also has problems. The output swing when the stage is in a limiting condition will then be quite high. The relatively high impedances necessitated by this approach result in a much lower bandwidth and considerably worsened recovery time from overload. Additionally, the higher power dissipation required by this approach has other repercussions. Consider, for example, the deleterious consequences of thermal effects on the gain stages. In order to achieve DC-coupled operation down to the sub millivolt level, it is necessary to take great care to ensure that the power levels are absolutely minimal, which means operating at low collector bias voltages. Recovery from overload will consist of two responses—a fast electrical response and a slower thermal response. Most, if not all, extant log converters exhibit poor thermal response, partly due to the large amounts of power to be dissipated. For low-frequency applications, thermal recovery may seriously impair the response accuracy to a small signal following close on the heels of a large one within a short time.

The present invention uses a deceptively simple gain stage based on a long-tail pair. The overall design nevertheless addresses all of the above issues. Biasing methods are used which achieve stable gain without use of feedback networks. Rigorous compensation techniques deal with finite beta and ohmic resistances implemented at a fundamental level rather than by add-on techniques. Minimum bias current and collector-base voltage commensurate with noise and bandwidth objectives minimize thermal distortion.

Figure 11:
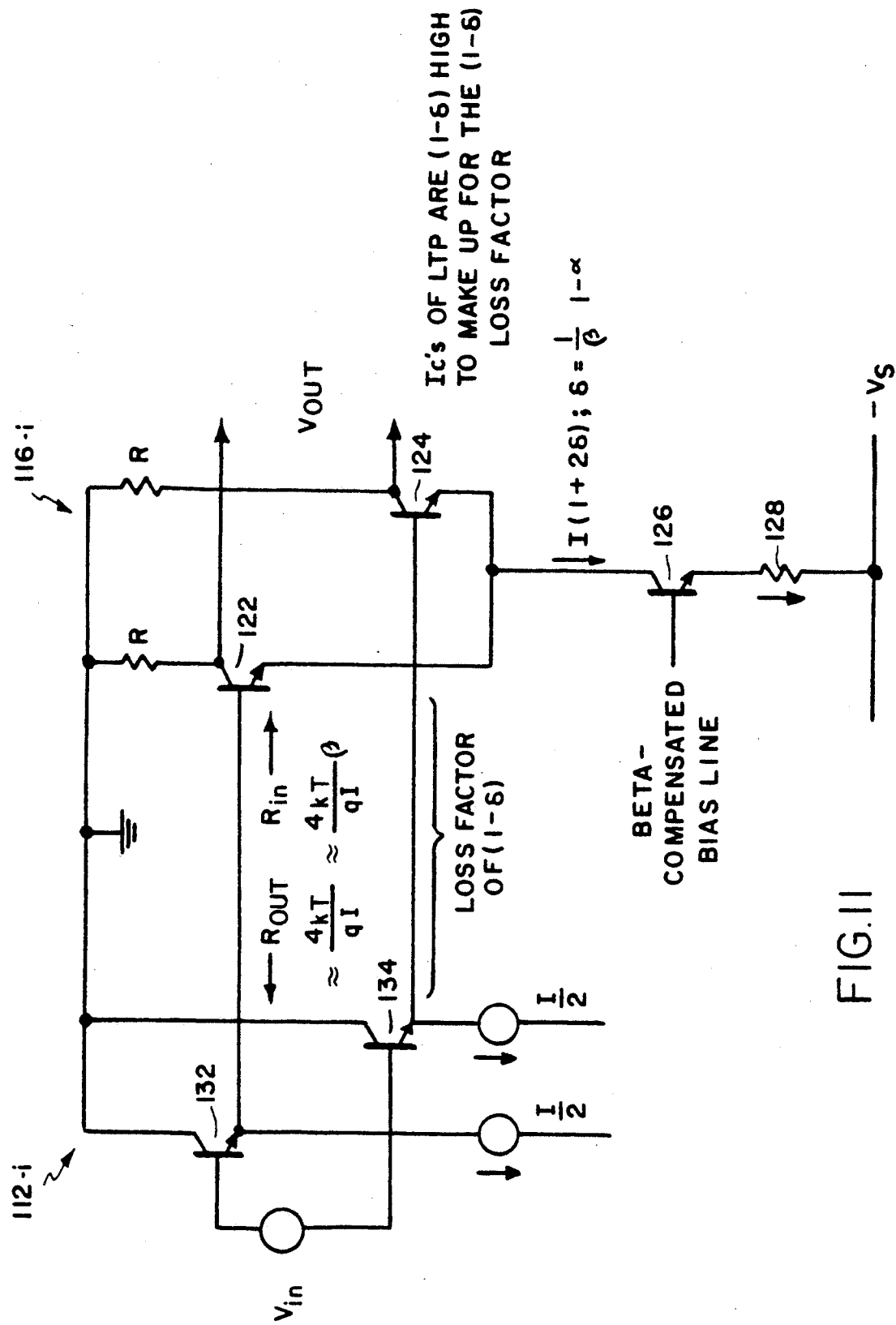
FIG. 11 is a simplified schematic circuit diagram of the emitter followers 112i and gain-compensated amplifiers 116i of FIG. 10.

Referring to FIG. 11, each amplifier limiter 100-i is a long-tail pair formed by transistors 122 and 124. Transistor 126 and resistor 128 form a current source for the long-tail pair. Application of proper bias to the base of transistor 126, as taught in the aforementioned U.S. Pat. No. 4,929,909, provides gain compensation. To the basic gain compensated long-tail pair of FIG. 11, two further refinements are made. First, emitter followers 132 and 134 are added to buffer the input. They serve a number of purposes. First, they raise the small-signal input resistance by about two orders of magnitude, with a reduction in the capacitance component of the input impedance. Second, they introduce level-shifting necessary to allow these gain stages to be cascaded indefinitely while retaining DC coupling. Third, they are useful in generating the demodulator voltage offsets, as explained below. However, the use of emitter-followers ahead of the long tail pair does have a down-side; it results in a modest increase in noise voltage.

Additionally, to complete the design of the gain stage, consideration is given to the matter of beta sensitivity. In the long tail pair, it is the collector current, not the emitter current, which determines the transconductance. Further, the bias applied to the base of current source transistor 126 actually sets its emitter current, not the collector current. Failing to properly account for the "alpha" current loss when going from emitter to collector introduces a gain error of about 1% (roughly 0.1 dB), with an associated temperature drift of typically 100 ppm/° C. Finally, the differential input resistance of the long-tail pair 122, 124 is driven by the differential output resistance of the emitter-followers, forming a loss network which typically may be about "one-alpha" in magnitude. The total alpha-related error thus amounts to about 0.3 dB. To compensate for this error, it is also necessary to account for the fact that some alphas are for devices at a low, essentially constant collector-base voltage, while others are supply-dependent. The bias-line voltage applied the to base of transistor thus has to be raised by the factor $(1+3/\text{beta})$. If the implementation is to be accurate, the bias generator must take account of the fact that two of the betas are for $V_{ce} \sim 0$ and the third is for $V_{ce}$ approxmately equal to the magnitude of the negative supply.

Demodulator Design

Figure 12:
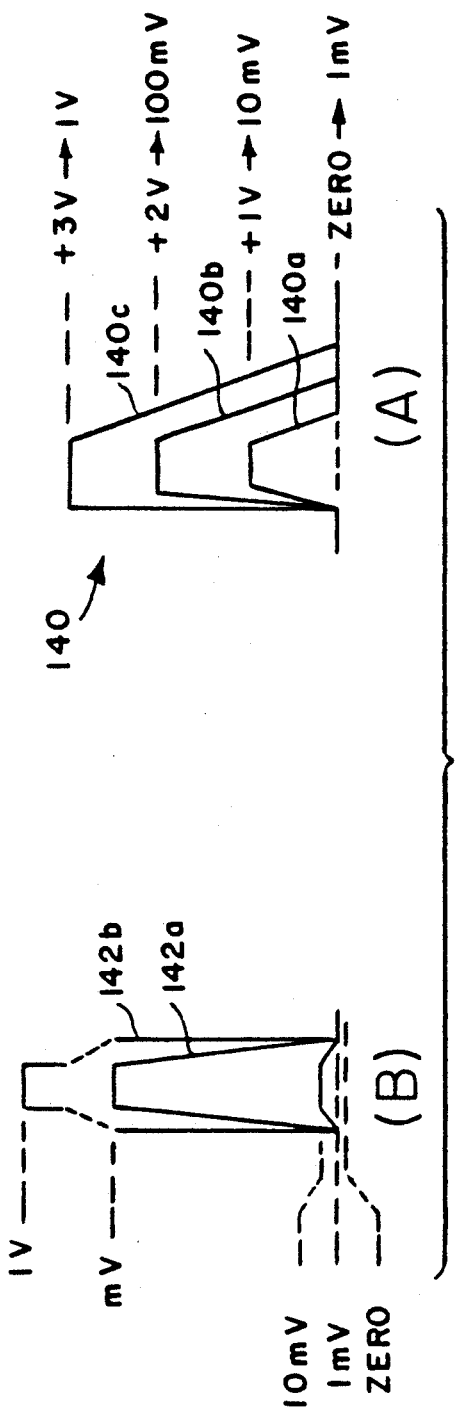
FIGS. 12 is a diagrammatic illustration showing in part A the output from a baseband log converter of the prior art to various inputs, shown in part B.
Figure 13:
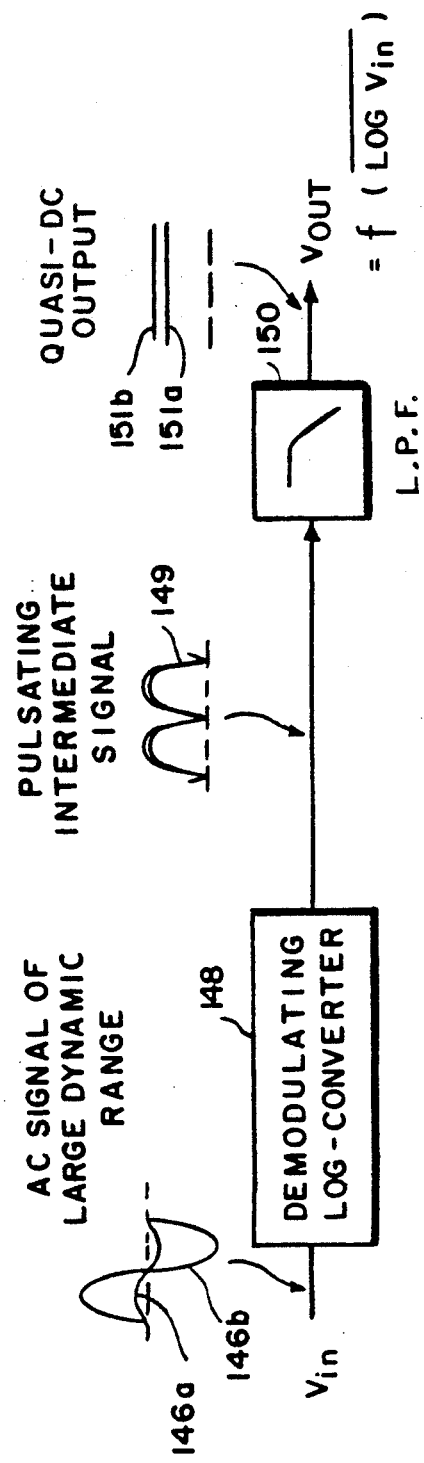
FIG. 13 is a diagrammatic illustration of the response of a demodulating log converter of the prior art to various inputs.

Logarithmic converters operate in two apparently disparate modes. In one, illustrated in FIG. 12 part A, the output signal 140 (e.g., 140a, 140b, 140c) has a basically similar spectrum to the input signal 142 (e.g., 142a, 142b) shown in FIG. 12, part B. This is the video, or baseband, mode, which may or may not require operation down to DC. In the second major mode, illustrated in FIG. 13, the input is a high-frequency AC signal which may have an amplitude of from a few microvolts up to several hundred millivolts peak. A logarithmic converter 148 is needed both to amplify the input (e.g., signals 146a or 146b) and to demodulate it, so that the envelope of the signal can be recovered by low-pass filtering the rectified waveform 149 using a filter 150 to produce a quasi-DC output 151a or 151b, respectively. A converter which operates this way may be called a "successive-detection" or "progressive-compression" log amplifier/converter, and is invariably AC coupled, with a high-pass corner frequency in the 0.1–10 MHz range, precluding operation in sonar, audio or general instrumentation applications. The present invention is unusual in that it can be operated in both modes. It incorporates demodulators, but is also DC-coupled.

The demodulators used in the present invention are of the full-wave type, which offers two important advantages over the half-wave design traditionally used in successive detection log-converters. First, it results in a much higher degree of circuit balance, which is very important in a high accuracy component. It also minimizes the possibility of high-frequency instability due to sneak paths in, for example, bias lines. Second, the demodulated output waveform will now be at twice the signal frequency, which simplifies the design of the low-pass filter which invariably follows detection. Indeed, in the special case where the signal input is an amplitude symmetric square wave, no filtering is required at all, in principle. This is almost true even for a sine wave input, since for a large part of the dynamic range, the limiters will compress the waveform prior to detection. The pulsating output current will dwell mostly near its maximum value, dipping to zero only briefly twice every cycle. This waveform is much easier to filter than a lumpy half-sine.

The demodulator stages may be viewed as simply the means chosen to sum the progressively-limiting voltage mode signals in the cascade of gain stages to the logarithmic output, by converting them to the current mode, so facilitating their summation. This requires a transconductance function at each stage.

The demodulators play a crucial role in scaling; that is, in determining the logarithmic intercept and slope.

Traditionally, the demodulator has been placed after each amplifier. There appears to be no particular advantage to such an arrangement, and the present invention breaks with this tradition by placing the detectors before the respective amplifier/limiter, which has the advantage of adding more than 10 dB (the stage gain) to the upper end of the dynamic range. This approach makes it appear that the final amplifier/limiter is always redundant, but it actually is used when two such log converters are cascaded; the end stage of the first converter is used to provide the required 10 dB to the first stage of the second converter. However, the present invention does not preclude use of a final detector on the final output stage.

Connecting the demodulator input after the emitter followers in each gain stage results in each gain stage having a high, and almost linear, input impedance, whereas the input impedance of the demodulator is fairly low and very non linear. Second, it provides some needed level-shifting, so that the outputs of the demodulators can still be at analog ground level. Finally, it provides the means for generating the demodulator offset voltages.

Figure 14:
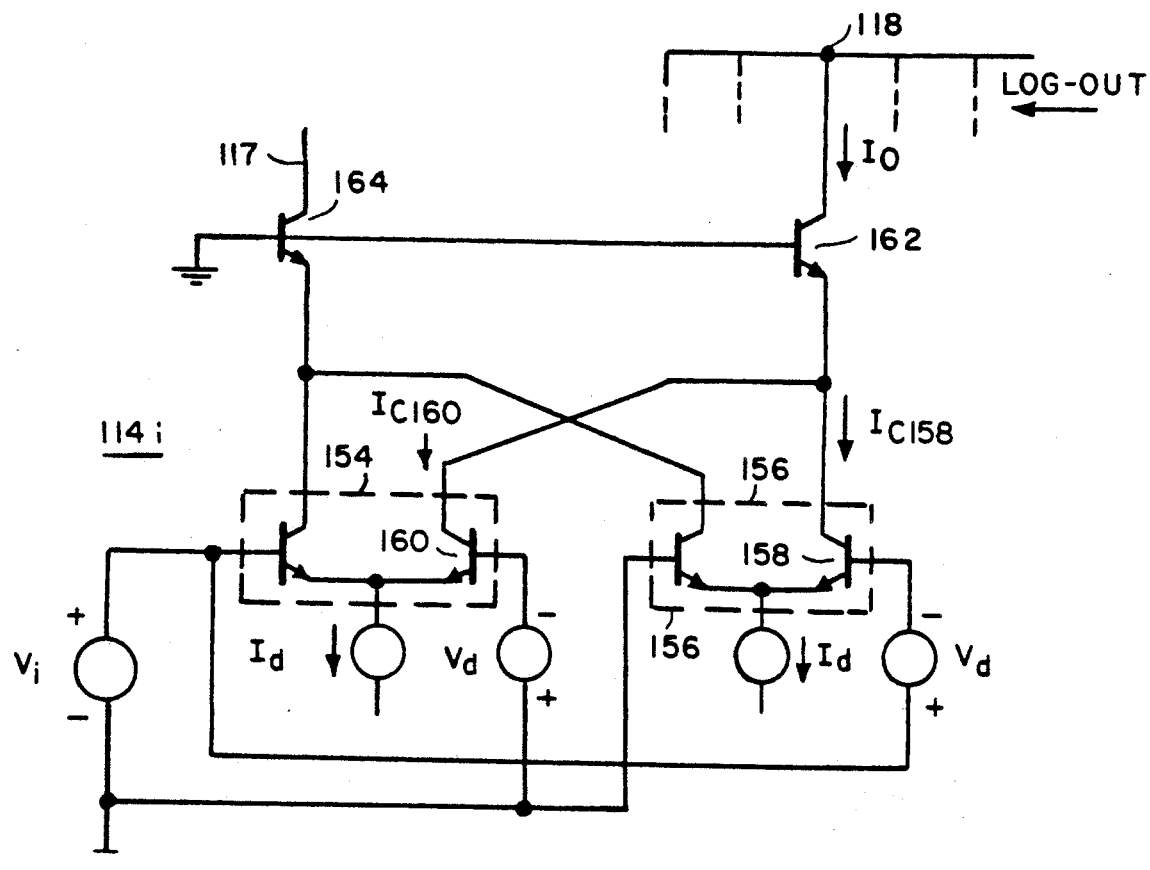
FIG. 14 is a simplified schematic circuit diagram of the demodulator 114i of FIG. 10.
Figure 15:
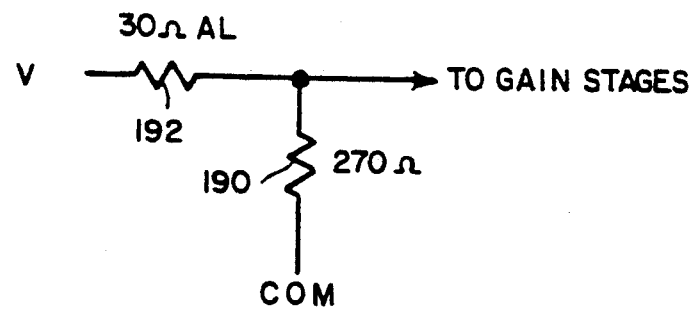
FIG. 15 is an illustration of a PTAT attenuator accoording to the present invention, for use in compensating for temperature-induced movement of the intercept voltage.

FIG. 14 shows the core of the full wave demodulator. It is based on two long-tail pairs, 154 and 156, assumed to be built from ideal, identical transistors. Each is supplied with a tail current $I_d$, which will be referred to as the detector bias, and offset bias voltage $V_6$, called the detector offset. A single-sided signal is assumed here, since its common mode component has essentially no effect on the basic behavior. But in fact the input signal is usually the balanced voltages for the preceding limiter stage. This signal has a general value of $V_i$, and a peak value of $+/-V_p$. For all but the first detector, this peak value is constant at about, for example, 163.5 mV at 300 K, from the preceding limiter stage.

The logarithmic outputs from the core demodulator circuit are buffered by cascode stages 162, 164.

The output of concern in this analysis is $I_o$, the sum of the collector currents of transistors 158 and 160, modified by the one-alpha transformation provided by 162. The sum of $I_o$ for all n demodulators is the negative output signal from the converter, LOG−OUT.

To understand the behavior of the demodulator core, it is necessary to consider the detector offset, $V_d$. Note first that there is a value of $V_d$ which maximizes the efficiency of the detector in the sense that it results in the largest change in output between the zero signal condition and the fully-limited condition.

If $V_d$ were made PTAT, the fractional part of $I_d$ reaching the output $I_o$, under zero-signal conditions, will be constant for all temperatures, and since the overall logarithmic slope is proportional to $I_d$, this current must also be temperature-stable. Therefore, the zero-signal value of $I_o$, which will be called $I_{ozi}$, can be accurate and stable, and can be removed, using a further stable current-source, to place the final zero-signal output at any value desired. This opens the way to accurately position the intercept for the complete circuit at a convenient value. Thus, it is no longer important to use a large value of $V_d$ to render the detector output current nearly zero for zero-signal conditions, as is conventionally taught. $V_d$ can now be chosen to optimize, for example, detector efficiency, or to lower signal levels which in turn allows use of lower impedances and thus yields higher bandwidth.

The peak input to the detector, $V_p$, is also PTAT. Consequently, the scaling of the detector stages will be locked in over temperature, and the possibility of an accurate, fully-calibrated detector emerges. Calculations reveal that with the long-tail pair amplifier described earlier, $V_p$ (the peak input to the detector) is directly proportional to the small signal gain and is simply 2GkT/q. Using the values $V_p=63.5$ mV at 300 K, $G=10^{\frac{1}{2}}=3.162$, and $kT/q=25.85$ mV at 300 K, the detector efficiency will be found to peak at $V_d=91.5$ mV, a value much lower than that typically used in the prior art. Further, by operating at or near this peak, the sensitivity of scaling to this voltage is much reduced.

As stated above, the ideal function is $$I_{out} = I_y \log \frac{V_{in}}{V_x} \quad (40)$$

Stabilization of the intercept voltage $V_x$ is thus essential for a log converter to be a precision measurement device. In fact, it can be shown by analysis that $V_x$ is PTAT.

One way to achieve compensation is to precede the signal input with a signal whose gain is PTAT. Another, less obvious, way is to add a temperature compensation current to the output. To observe that this is possible, consider that $V_x$ can be expressed as $$V_x = (T/T_r)V_{xr}, \text{ where } V_{xr} = kT_r/q,$$

where T is the actual temperature, $T_r$ is the reference temperature at which $V_x$ is specified and $V_{xr}$ is the desired fixed intercept. Equation 40 can then be rewritten:

$$I_{out} = I_y \log \frac{V_{in}}{V_{xr}} + I_y \log \frac{T_r}{T} \quad (40')$$

Thus compensation can be achieved by subtracting from the output current a current equal to the second term. Assuming that the refence temperature is 300K and $I_y=1$ mA, the compensation current must be $$I_{comp} = -1 \text{ mA log } (T/300K).$$

The foregoing explanation addresses explicitly the treatment of the negative going output LOG−OUT, but it will be understood that a similar compensation current can be employed for the positive going output LOG+OUT.

Figure 17:
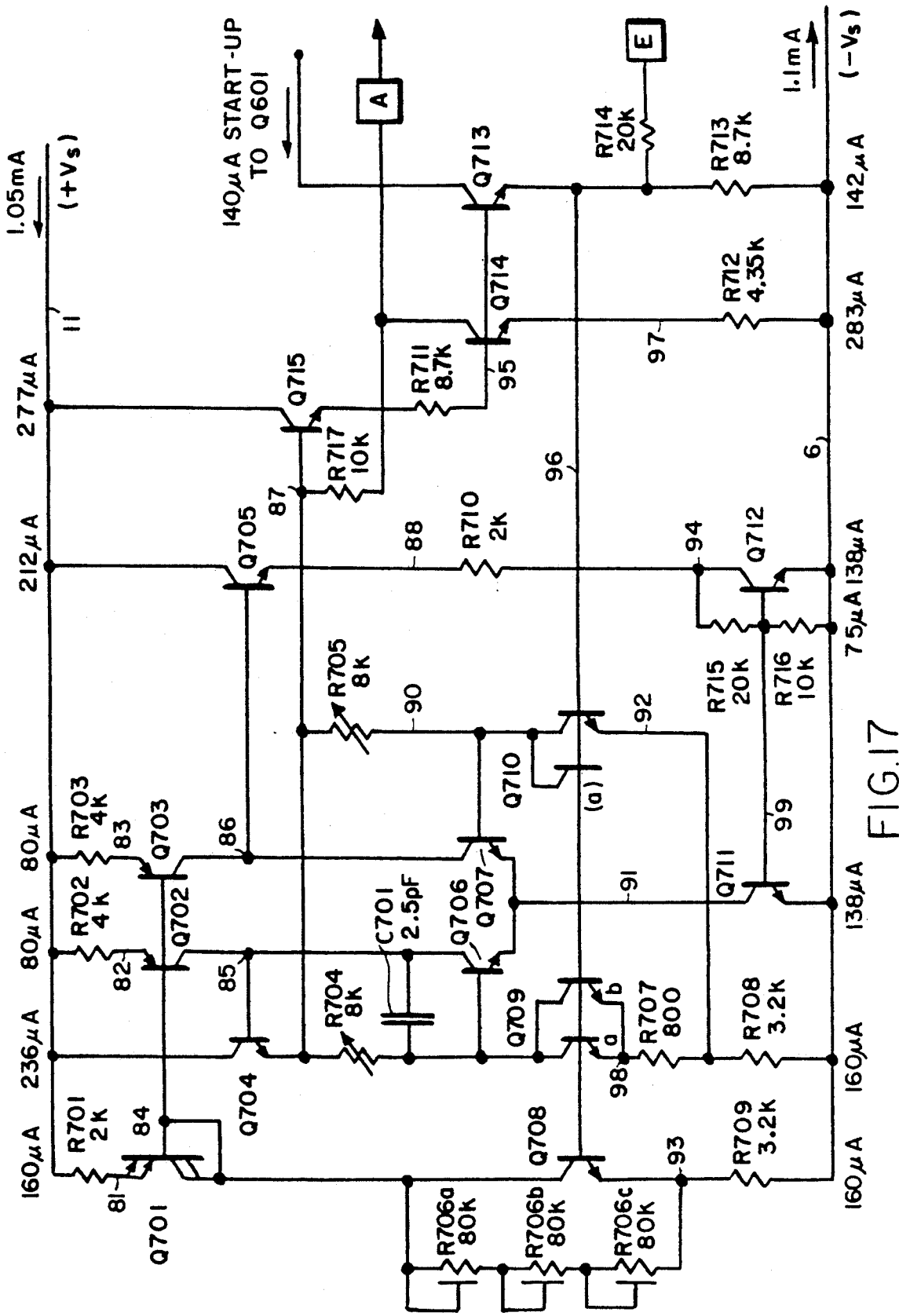
FIG. 17 is a detailed schematic circuit diagram for an embodiment of the scale reference 104 of FIG. 9.

The use of a PTAT gain to cancel the PTAT character of $V_x$ can be achieved with an L-network attenuator having a high temperature coefficient resistor in its output branch and a fixed resistor in its transfer branch. For very high attenuation ratios, the high temperature coefficient resistor would need to be exactly PTAT, because it is essentially current-driven. For lower ratios, this resistor would need to have a higher-than PTAT temperature dependence. Fortunately, aluminum has just about the right temperature coefficient for a 10:1 (20 dB) attenuator. Moreover, since a resistance of only about 30 ohms is needed, is can be fabricated from an interconnect metal layer which will be available during chip fabrication, assuming aluminum interconnects are used. Using a two-layer metal system, the resistor can be doubled-back on itself, to keep inductance low, although that is not an essential feature. A suitable PTAT attenuator is shown in FIG. 17. Resistor 190 is a fixed resistor, nominally 270 ohms. Resistor 192 is the aluminum resistor, having a nominal value of 30 ohms.

Both the intercept-compensating current and the PTAT attenuator are useful. Under many circumstances, the use of the attenuator may be preferred, but in other circumstances, such as where signal levels are low, the compensating current is favored. Further, when using in series two log converters (each in a single IC package) of the type disclosed herein, the necessary temperature compensation must be applied only once. It is thus necessary, if the IC's are to be cascaded, to provide a way to disable the compensation at the user's option.

In the demodulating mode, the effective intercept is waveform dependent. Thus it should be appreciated that a square wave signal is assumed in the foregoing analysis. Suitable adjustment can be made for other signals.

The Amplifier/Limiter

Figure 16:
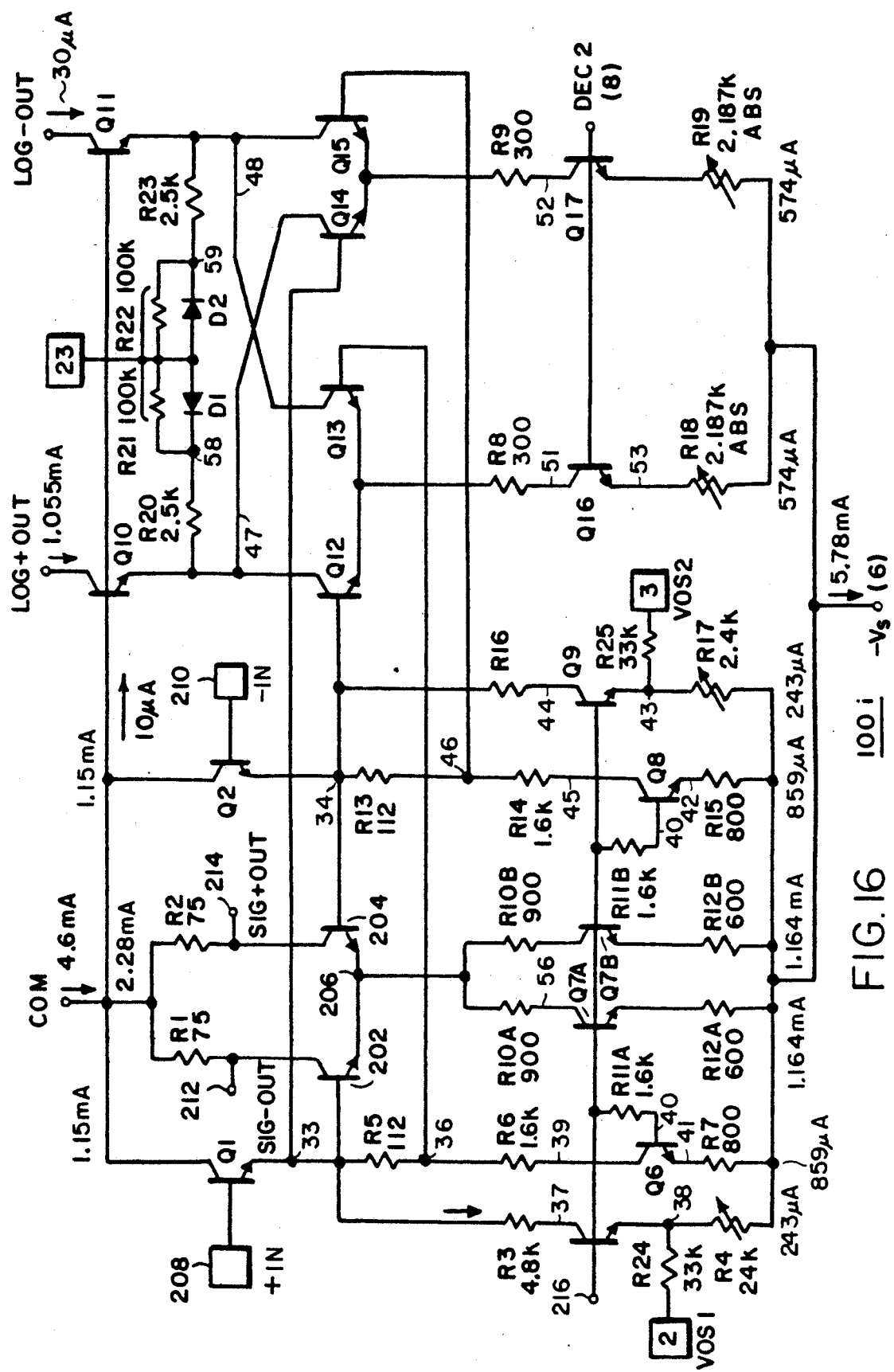
FIG. 16 is a detailed schematic circuit diagram for an embodiment of a gain stage 100-i of FIG. 9.

The gain stages 100-1 through 100 n of FIG. 9 are essentially identical. Each provides a small-signal gain of typically 10 dB between its differential inputs and differential outputs. A schematic circuit diagram for a typical one of the stages 100-i, is shown in FIG. 16. As discussed in the above-referenced U.S. Pat. No. 4,929,909, transistors 202 and 204 form a classical "long-tail pair" whose gain is determined by the tail current and load resistors R1 and R2. The signal input is impressed across terminals 208, 210. The amplified input signal for driving successive stages (or another converter) appears at nodes 212 and 214. The tail current for a gain of 3.162 (i.e., 10dB) is nominally 2.18 mA at 300 K and must be basically PTAT. In practice, this current is higher than the basic theory suggests, since it includes compensation for ohmic errors and finite beta. This adjustment is provided by the design of the gain-bias generator 102. The bias design is such that the irrational value for the gain can be achieved using rational resistor ratios in each of the gain stages, thus improving the as-fabricated gain accuracy by the use of similar unit resistances. The emitter bias resistors R12A and R12B and the load resistors R1 and R2 fix the gain.

R10A and R10B are included to decouple the emitter node 206 from the collector capacitance of the current-source transistor Q7A and Q7B and thus improve the bias line isolation at high frequencies. In fact, hardly any signal voltage appears at this node in all but the first stage, due to the balanced differential signal paths, which helps to decouple the circuit from the power supply. For zero-signal conditions, the output nodes 212 and 214 are theoretically 81.75 mV PTAT below analog common (i.e., ground), and each swings to a peak value between 0 and $-163.5$ mV PTAT in the presence of an input signal. In practice, because of the bias compensation, which increases the tail currents supplying transistors Q3 and Q4, the voltages are slightly higher than this. A peak output swing of 180 mV at 300 K is typical.

Emitter follower transistors Q1 and Q2 typically operate at 1.09 mA PTAT, most of which is supplied by transistor Q6, or Q8, respectively, and the remainder of which is supplied by transistors Q5 and Q9, respectively. This scheme provides a means for introducing an offset voltage adjustment to the gain stage, which has a fairly narrow range and which does not alter the demodulator offset voltage, $V_6$, which appears across resistors R5 and R13. Resistors R11A and R11B remove two of the "three-betas" bias compensation, since neither the demodulator offset nor the emitter-follower bias need the full amount of this compensation.

Resistors R4 and R17 are differentially trimmed to null input offset voltage in the first stage 100-1. It may be useful in the second stage also, either to provide a slight addition to the available range, or for use as a fine trim, for the first stage.

Resistors R3, R6, R14 and R16 are decoupling resistors which reduce the displacement currents in the collector-base capacitances of transistors Q5, Q6, Q8 and Q9, which flow into the gain bias line 216. These currents ought to cancel exactly, but an abundance of caution has been used to avoid spurious coupling through the bias lines, which might lead to instability or other spurious response in a complete amplification system which might have over 100 dB gain and over 100 MHz bandwidth. All collector decoupling resistors were chosen so that the associated current-source transistors are not saturated when the negative supply $-V_s$ is $-4$ V. The combination of the base-emitter voltages of transistors Q1-Q2, 202, 204 and Q5-Q9, with the PTAT bias voltage, works nicely to virtually eliminate the temperature dependence of the minimum supply voltage.

The full wave demodulator consists primarily of transistors Q12–Q15. The offset biases which are needed to introduce the non linearity are PTAT, and it is possible to generate at least some of this offset through the use of emitter-area scaling, and it is appropriate in certain situations to do so. However, this it results in unequal, high-frequency displacement currents through the unequal collector-base capacitances of the scaled devices. Therefore, equal-area devices are used in the illustrated embodiment and generate the full offset voltage across resistors R5 and R13.

The basic action of the demodulator can be understood by considering just the negative LOG−OUT signal, as the positive LOG+OUT signal is its complement. Under zero-signal conditions, transistors Q13 and Q15 are not cut off, but conduct a small amount of the tail current, instead. About 2.8% of the tail current typically appears in each collector. The illustrated design value of the tail current is 564.6 μA. Thus, each full stage contributes a zero-signal current of 31.8 μA to the output cascode. For five stages, this comes to 159.6 μA. This is a stable current, since the tail current is basically temperature-stable, in contrast to the gain-stage bias. The tail current will actually be slightly higher than nominal, due to corrections for finite beta and ohmic resistance built into the bias line voltage.

For all demodulators except the demodulator in stage 100-1, the maximum drive occurs when the preceding gain stage is heavily limiting. To facilitate analysis, assume that node 18 is "high" (i.e., at the level of ground or COM) and node 1 is "low" (i.e., nominally at $-163.5$ mV at 300° K.). The emitter followers Q1 and Q2 shift these input voltages down through equal base emitter voltages. Consequently, the base of transistor 215 is at 163.5 mV$-91.5$ mV$=-225$ mV with respect to the base of transistor Q14, and most of the tail current to this pair flows into transistor Q10. The base of transistor Q12 is at $-163.5$ mV$+91.5$ mV$=-72$ mV with respect to the base of transistor Q13, so the tail current to this pair is divided with 94.2% (i.e., 531.8 μA) in transistor Q13 and 5.8% (i.e., 32.8 μA) in transistor Q12.

The current in the cascode transistor Q11 has thus risen from 31.8 μA under zero-signal conditions to 531.8 μA at full limiting. Thus, the change in output current at the negative output terminal between zero-signal and full limiting is 500 μA. Since the detectors are spaced at 10 dB intervals, the scaling is 500 μA for 10 dB of system input, or 1 mA per 20 dB, which is 1 mA per decade, the design objective.

The detector bias currents are trimmed absolutely, by adjustments to resistors R18 and R19, to allow output currents to be combined without loss of accuracy. During trimming, all bias conditions are undisturbed, but the outputs from only one detector stage are allowed to reach the "LOG−OUT" and "LOG+OUT" outputs. The switching is performed during laser trimming at the wafer level by pulling up on the emitters of the cascode transistors Q10 and Q11, using the probe-pad nodes 19-1 through 19-5. Diodes D1 and D2 prevent a direct-current path between the cascode emitters during normal operation. Resistors R21 and R22 ensure that there is a defined bias state in these diodes when the control nodes are left floating. Because the diodes have finite capacitance, resistors R20 and R23 are included to lower the Q of any resonances which could be caused by these capacitances and the inductive-like impedance of the cascodes. Being series-tuned, they could lead to large amounts of AC current being transferred between emitters, badly affecting the 943 high-frequency response of the demodulators.

The Scale Setting Reference

FIG. 17 shows a schematic circuit diagram for a scale bias generator 104. It follows a somewhat similar design to the gain setting reference, in that it uses a band-gap cell (as explained, for example, in P.Horowitz and W.Hill, *The Art of Electronics*, Cambridge University Press (Cambridge, England) 1980 at 195–96), but in this case the full band-gap principle is invoked. That is, the voltage appearing at the probe pad E is trimmed to the value which results in essentially a zero first-order temperature coefficient at 50° C. the center of the chip temperature range. Probe pad E and a separate Kelvin sense probe to $-V_s$ provide high-accuracy access to the band-gap cell.

Start-up current is provided by the series connected pinch resistors $R706_a$ $R706_c$. Transistors Q702 and Q703 conduct weakly at first, causing transistors Q704, Q715, Q713 and Q708 to conduct, reinforcing the initial start-up and ending with a steady state for the circuit in which Q702 and Q703 conduct about 80μA PTAT. Band-gap "core" devices Q709 and Q710 have an emitter area ratio of 12, and they operate at nominally equal currents by virtue of the nominal equality of resistors R704 and R705. The differential base emitter voltage which appears to cross resistor R707, in the absence of ohmic errors in the core, is close to 64 mV at 300 K. The operating current for these transistors is set by resistor R707 to about 80 μA PTAT. The voltage across resistor R708 is nominally 512 mV PTAT, which sums with the 969 base-emitter voltage of transistor Q710 to generate 1.235 V (with respect to $-V_s$) the base node 96.

A dummy transistor Q710a is included to equalize the leakage currents at the collectors of the cell transistors and improve accuracy at high temperatures. The capacitance of this device also plays a role in the high-frequency stabilization of the circuit.

The operating currents of the differential amplifier formed by transistors Q706 and Q707 are set by the common mode control loop embracing transistor Q705 and the current mirror transistors Q711, Q712. Resistors R710, R715 and R716 are chosen to place the base of transistor Q705 at essentially the same voltage as the base of transistor Q704 (over temperature) and thereby equalize collective voltages of the amplifier stage. The bias current in transistor Q705 is the sum of about 160 μA PTAT and 60 μA CTAT (i.e., complementary to absolute temperature). The main control loop embraces transistors Q704, Q715, and Q713. Transistor Q715 drives the current-sources in the demodulator stages and the offset generators. Most of its emitter current, however, is provided by transistor Q714. Resistor R717 is included solely to generate a 60 μA CTAT current, which sums with the 160 μA PTAT current from the tops of resistors R704 and R705 to ensure that transistor Q704 operates at the same emitter current as transistor Q705. This minimizes the bias offset current injected back into the amplifier stage of transistors Q706 and Q707.

Transistors Q713 and Q714 provide special beta compensation. The design follows similar lines to that described for the gain-bias generator, in that precisely metered increments of compensation are added to the bias line, in this case node A. Transistor Q713 operates at the same collector-base voltage and current density as the detector current-sources, transistors Q16 and Q17. Thus, its alpha tracks theirs, and the voltage across resistor R711 generated by the base of transistor Q713 raises the biased line by the increment needed to eliminate the alpha error in transistors Q16 and Q17. On the other hand, transistors Q11–Q15 in the demodulator core operate at $V_{cb}=0$, and thus have lower, and supply-sensitive, alpha. The same is true of the cascode transistors Q10 and Q11, whose alpha is "in series" with the core transistors. Thus, transistor Q714 operates at twice the current as transistor Q713, but is designed to have the same current density, and the resulting voltage increment across R711 compensates for the core and cascode alphas.

Scale Offset Generators

Figure 18:
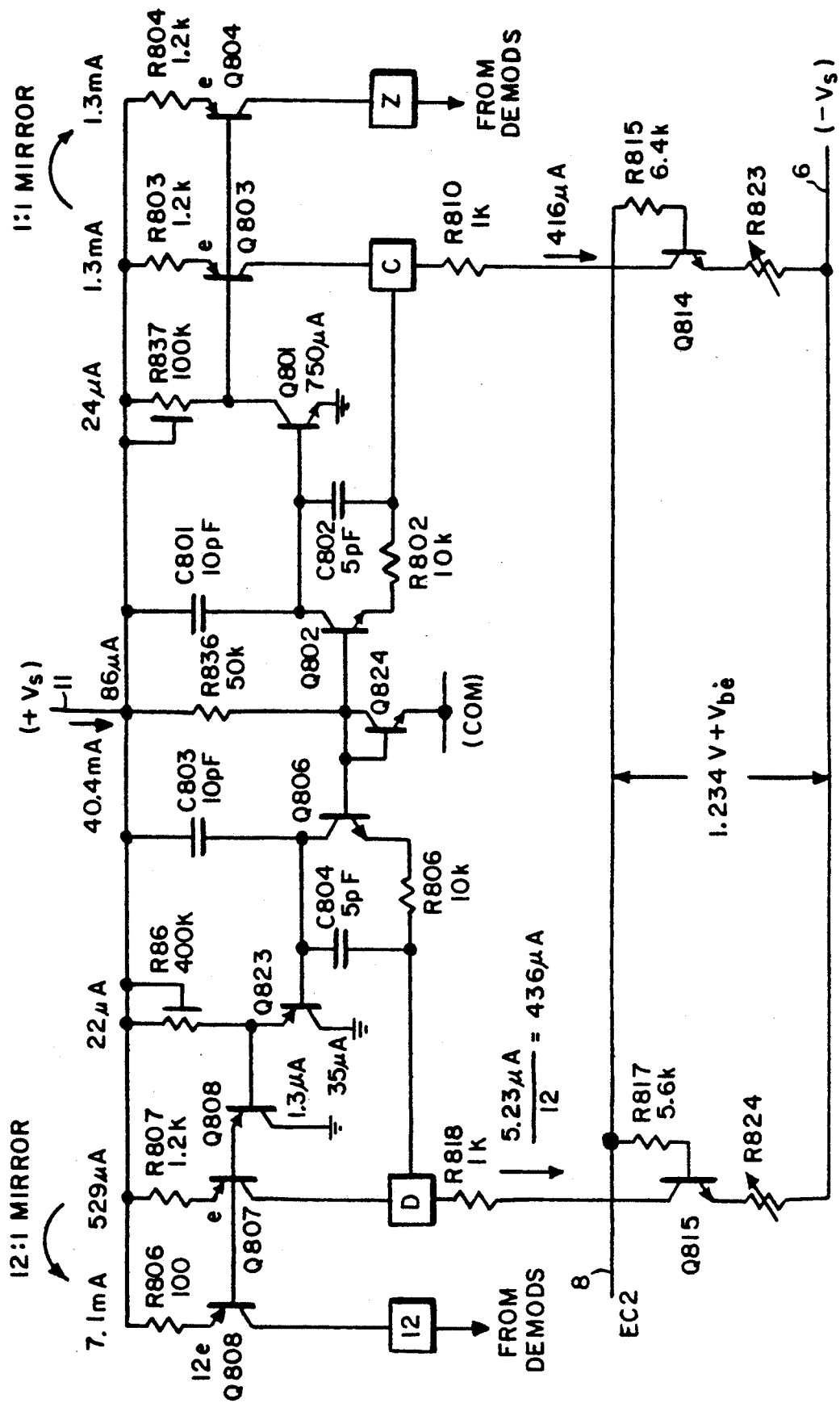
FIG. 18 is a partially simplified schematic circuit diagram for an embodiment of the scale offset generator 106 of FIG. 9.

A schematic circuit diagram for an exemplary offset generator 106 is shown in FIG. 18. This circuit is critical to the accurate positioning of the intercept voltages.

For the negative output terminal, a current of 416 μA is needed, to place the intercept at 1 mV. This is generated by transistors Q814 and resistor R823, which is trimmed to absolute calibration. Resistor R815 removes two of the beta-compensation terms, since only the alpha of Q814 introduces an error. A current mirror formed by transistors Q803 and Q804 supplies an offset current at node Z. Extra current-gain is provided by transistor Q801, a 4-unit substrate PNP transistor. Transistor Q802 drives the base of transistor Q801. Its base is elevated to a base-emitter voltage above ground by transistor 824, which is biased at about 100 μA by resistor R836. The emitter of transistor Q801 is therefore close to ground, ensuring that the collectors of transistors Q803 and Q804 operate at virtually the same collector-base voltage when the output at node is absorbed at the virtual ground of an external operational amplifier. This eliminates sensitivity to the $+V_s$ supply.

Resistors R803 and R804 are chosen so that for minimum data in transistors Q803 and Q804, and extremes of temperature, node 13 can move to within 1 V of $+V_s$.

Junction capacitors C801 and C802 provide high-frequency stabilization. Capacitor C801 forms a pole with resistor R803 at 14 MHz. Capacitor C802 shunts transistor Q802 with a zero at about 1 MHz. Resistor R802 is included to bound the upper limit of the transconductance and discourage the possibility of a relaxation oscillation. Resistor R837 absorbs the leakage currents of transistor Q802 multiplied by the beta of transistor Q801, to prevent a loss of control at high temperatures.

The complementary output from the detectors, which is the basis of the positive "LOG+OUT" output, is harder to offset with high accuracy, since it requires a current of about 5.23 mA at 50° C. To avoid the use of a drive current of the same magnitude, the current mirror used for this offset has a gain of 12. To ensure accurate gain over temperature, an extra PNP follower, transistor Q823, is included. The high frequency compensation is essentially unaltered, except that transistor Q806 operates at a much lower current than its counterpart transistor Q801, and the zero formed by $r_e$ and capacitor C804 is now at about 200 kHz. Resistors R807 and R808 are chosen to ensure that node 12 can approach within 1 V of $+V_s$ over the full temperature range and with minimum PNP betas, and also to ensure that transistor Q806 does not saturate. Resistor R383 absorbs the leakage current of transistor Q806 multiplied by transistor Q823. Resistors R818 and R810 are included solely to minimize of spurious self-oscillation in transistors Q815 and Q814.

Figure 19:
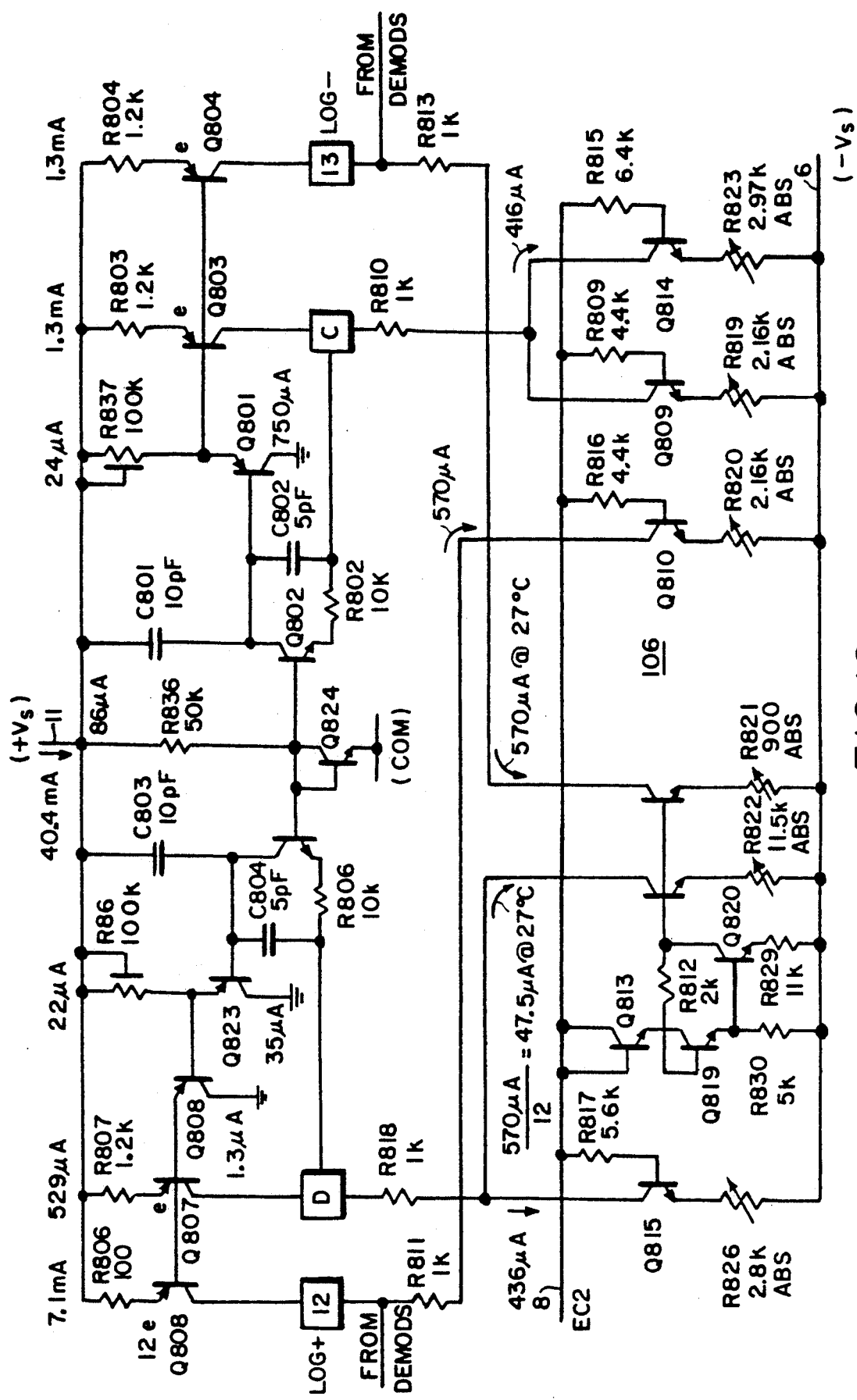
FIG. 19 is a more detailed schematic circuit diagram for an embodiment of the scale offset generator of FIG. 18, showing additional temperature compensation generators.

FIG. 19 shows the added temperature compensation generators discussed above. Transistor Q809 generates the fixed component of 570 μA, which is reflected into node 13 by the 1:1 mirror. Transistor Q811 provides the temperature-variable component (27 μA at 27° C.), which varies from 488 μA at −40° C. to 708 μA at +40° C. Transistor Q810 generates another 570 μA fixed current, which is applied directly to the positive output node, since this is the phasing needed for this output. The temperature-dependent component is generated by transistor Q812 and reflected into the output by the 1:12 mirror. It is 570 μA /12 =47.5 μA at 27° C.

All of these currents must be trimmed to absolute value, and since the chip temperature is not known precisely, the collector currents of transistors Q811 and Q812 will have to be trimmed functionally. Thus, the fixed currents are trimmed first, and the temperature-dependent currents are trimmed to adjust the intercept to 1 mV, independently for each output. This is done using a 10 mV 1kHz square-wave input, and reading the low-pass filtered output. In this way, any offset voltage at the input, such as due to a residual internal offset, will negligibly affect this calibration step.

The foregoing detailed description of an illustrative embodiment of the invention, it will be understood, is presented by way of example only. Other implementations will readily be perceived by those skilled in the art, as will various alterations, modifications and improvements which are suggested by this disclosure, though not explicitly mentioned. Accordingly, the foregoing description is intended to be illustrative without being limiting. The invention is limited only as required by the following claims and equivalents thereto.

What is claimed is:

1. A logarithmic converter for supplying in response to an instantaneous input signal an output signal representing a corresponding logarithmic value thereof, the performance of the converter being characterized at least in part by a log intercept value and by a log slope, and comprising:
   a. a plurality of gain stages, each having
      (i) a transistor amplifier which has an input and an output, and
      (ii) a full-wave detector having an input and an output, the input of the full-wave detector being connected to receive the output of the transistor amplifier;
   b. a first one of the amplifiers being connected to receive at its input the input signal;
   c. each other amplifier being connected to receive at its input the output from another one of the amplifiers;
   d. the full-wave detectors each supplying a current output and the current outputs of all of the detectors being summed to provide the converter's output; and
   e. stabilization means operatively associated with each amplifier to cause the gain of the amplifier to be substantially insensitive to temperature variations and variations in production tolerances of the amplifier transistors.

2. The logarithmic converter of claim 1, wherein the transistor amplifiers are differential amplifiers biased by a tail current and wherein the stabilization means includes means for generating a tail current for each amplifier, which tail current is substantially proportional to absolute temperature.

3. The logarithmic converter of claim 2 wherein the means for generating the tail current is adapted to provide a tail current which is a function of the current gain of the amplifier transistors and their intrinsic resistances.

4. The logarithmic converter of any of claims 1-3 further including means for compensating for the temperature dependence of the detector output currents, to stabilize the log intercept.

5. The logarithmic converter of claim 4 wherein the means for compensating includes an attenuator at the input of the first amplifier, said attenuator providing an attenuation factor which is proportional to absolute temperature.

6. The logarithmic converter of claim 4 wherein the means for compensating includes means for combining with the summed detector output currents a current which compensates for changes in the summed current with variations in temperature.

* * * * *